(12) United States Patent
Frach

(10) Patent No.: US 9,087,755 B2
(45) Date of Patent: Jul. 21, 2015

(54) PHOTODIODES AND FABRICATION THEREOF

(75) Inventor: Thomas Frach, Aachen (DE)

(73) Assignee: Koninklijke Philips N.V., Eindhoven (NL)

( * ) Notice: Subject to any disclaimer, the term of this patent is extended or adjusted under 35 U.S.C. 154(b) by 893 days.

(21) Appl. No.: 12/597,177

(22) PCT Filed: Mar. 28, 2008

(86) PCT No.: PCT/IB2008/051173
§ 371 (c)(1),
(2), (4) Date: Oct. 23, 2009

(87) PCT Pub. No.: WO2008/129433
PCT Pub. Date: Oct. 30, 2008

(65) Prior Publication Data
US 2010/0127314 A1    May 27, 2010

Related U.S. Application Data

(60) Provisional application No. 60/913,589, filed on Apr. 24, 2007.

(51) Int. Cl.
*H01L 31/107* (2006.01)
*H01L 27/144* (2006.01)
*H01L 31/18* (2006.01)
*H01L 27/146* (2006.01)

(52) U.S. Cl.
CPC ...... *H01L 27/1443* (2013.01); *H01L 27/14659* (2013.01); *H01L 31/107* (2013.01); *H01L 31/1804* (2013.01); H01L 27/1463 (2013.01); Y02E 10/547 (2013.01)

(58) Field of Classification Search
CPC .................................................. H01L 31/107
USPC ............................ 257/21, 91, 225–234, 438, 257/E31.063–E31.064
See application file for complete search history.

(56) References Cited

U.S. PATENT DOCUMENTS

| 4,142,200 A | 2/1979 | Mizushima et al. |
| 6,380,528 B1 | 4/2002 | Pyyhtia et al. |
| 6,583,482 B2 * | 6/2003 | Pauchard et al. ............. 257/438 |
| 6,707,075 B1 * | 3/2004 | Rogers et al. .................. 257/117 |
| 6,943,390 B2 * | 9/2005 | Coffa et al. .................... 257/233 |
| 2001/0017786 A1 | 8/2001 | Woodward |
| 2002/0017609 A1 | 2/2002 | Danielsson |

(Continued)

FOREIGN PATENT DOCUMENTS

| JP | 2005045125 A | 2/2005 |
| WO | 2006111883 A2 | 10/2006 |

OTHER PUBLICATIONS

Gibbons, J.F., "Ion implantation in semiconductors—Part II: Damage production and annealing," Proceedings of the IEEE, vol. 60, No. 9, pp. 1062-1096, Sep. 1972.*

*Primary Examiner* — Mark Tornow

(57) ABSTRACT

A photodiode includes an anode (1202, 1302, 1402) and a cathode (1306, 1406) formed on a semiconductor substrate (402). A vertical electrode (702, 1314, 1414) is in operative electrical communication with a buried component (502, 1312, 1412) of the photodiode. In one implementation, the photodiode is an avalanche photodiode of a silicon photomultiplier. The substrate may also include integrated CMOS readout circuitry (1102).

18 Claims, 10 Drawing Sheets

(56) References Cited

U.S. PATENT DOCUMENTS

| | | |
|---|---|---|
| 2002/0066860 A1 | 6/2002 | Possin |
| 2005/0023475 A1 | 2/2005 | Li et al. |
| 2006/0192086 A1* | 8/2006 | Niclass et al. ............ 250/214.1 |
| 2009/0315135 A1* | 12/2009 | Finkelstein et al. .......... 257/438 |
| 2010/0245809 A1* | 9/2010 | Andreou et al. .............. 356/222 |

* cited by examiner

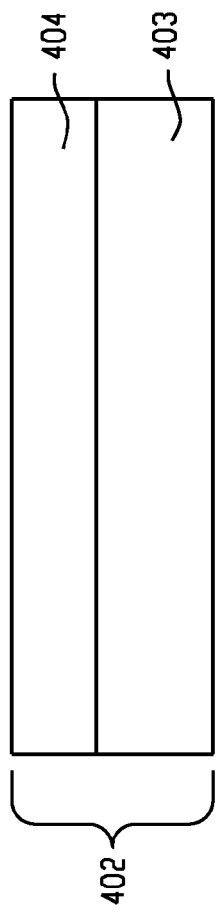
Fig. 4
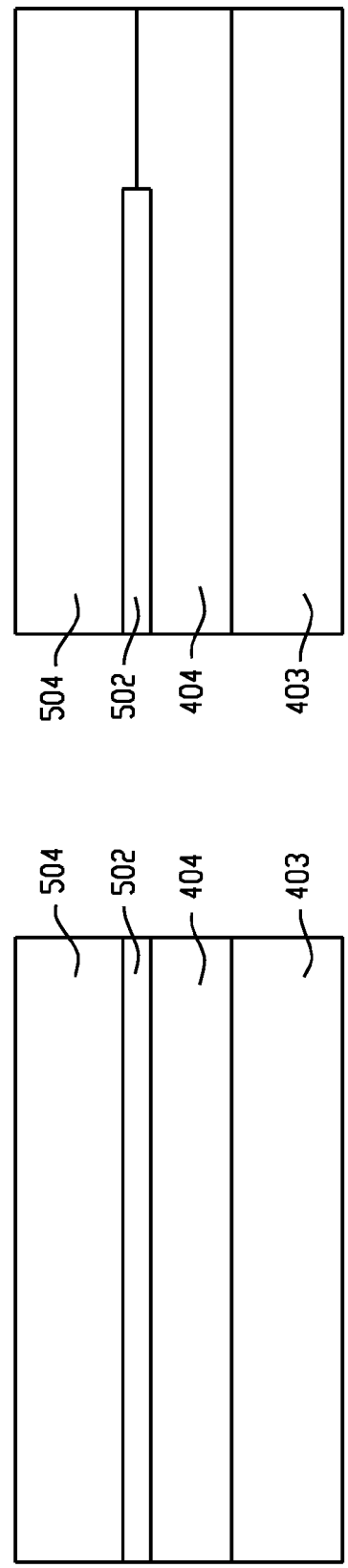
Fig. 5B
Fig. 5A

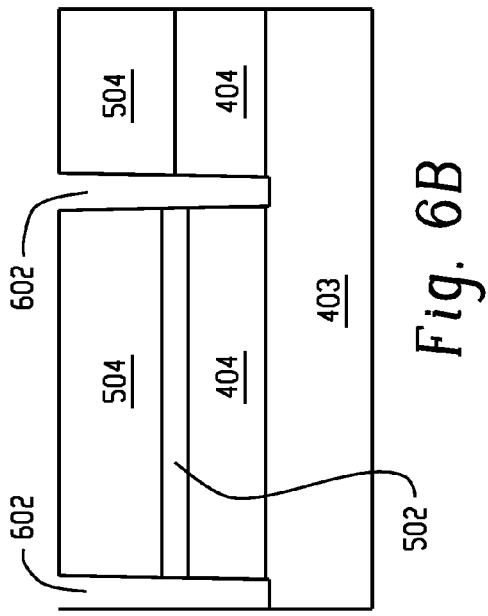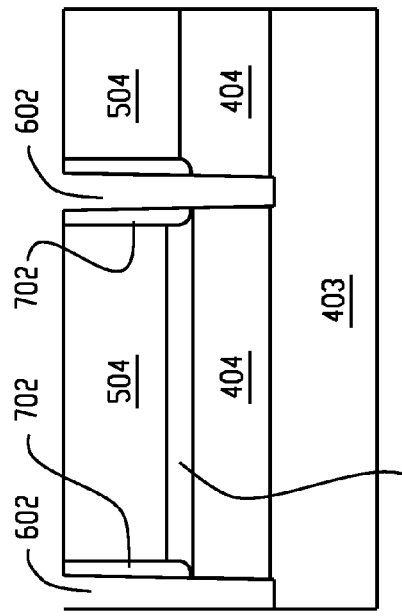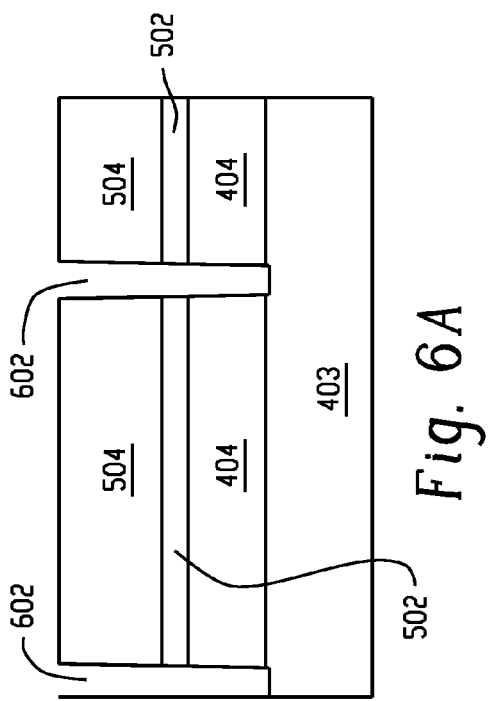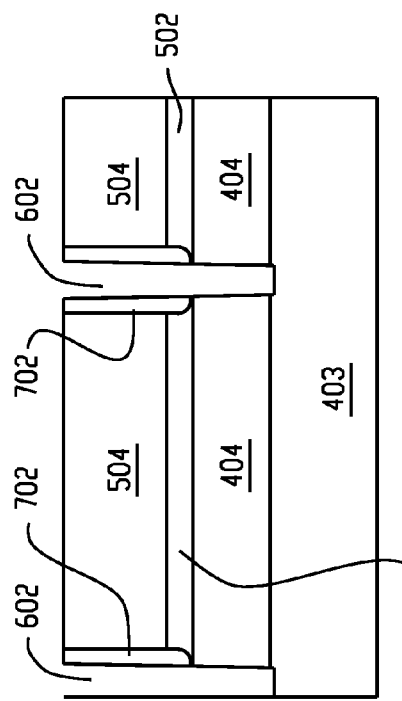

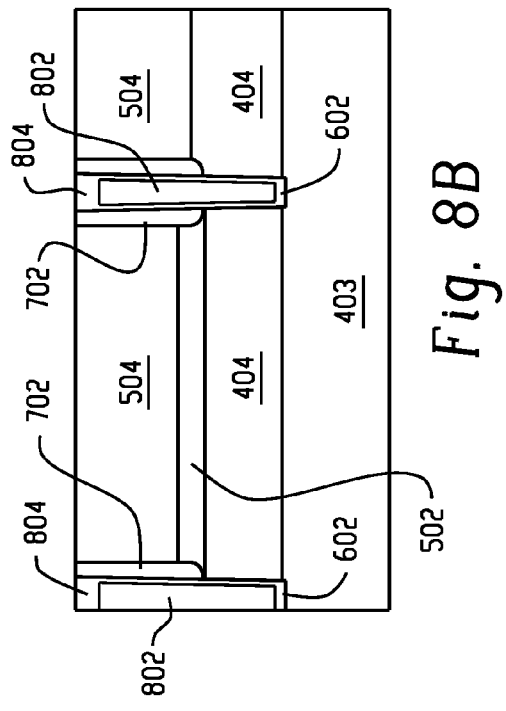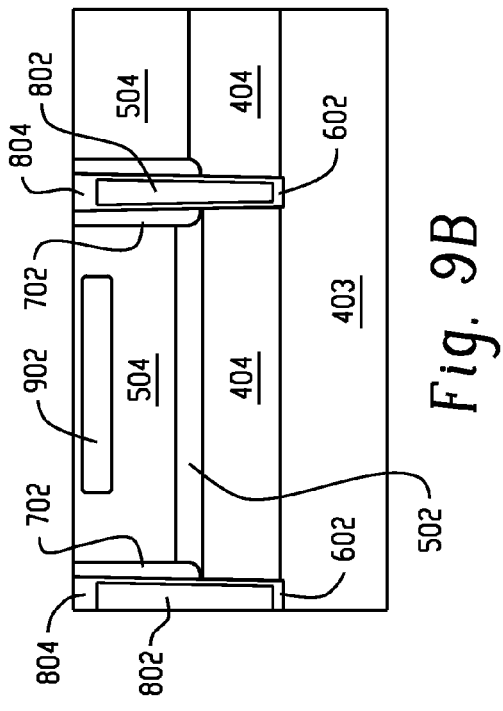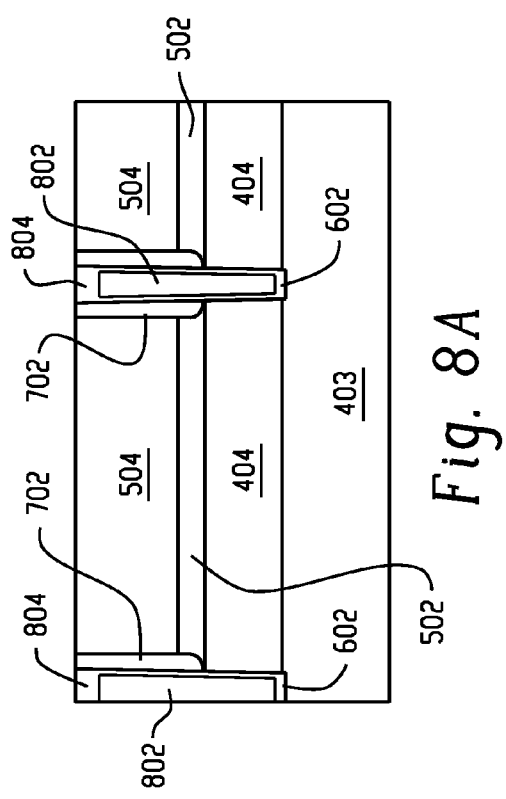
Fig. 8A
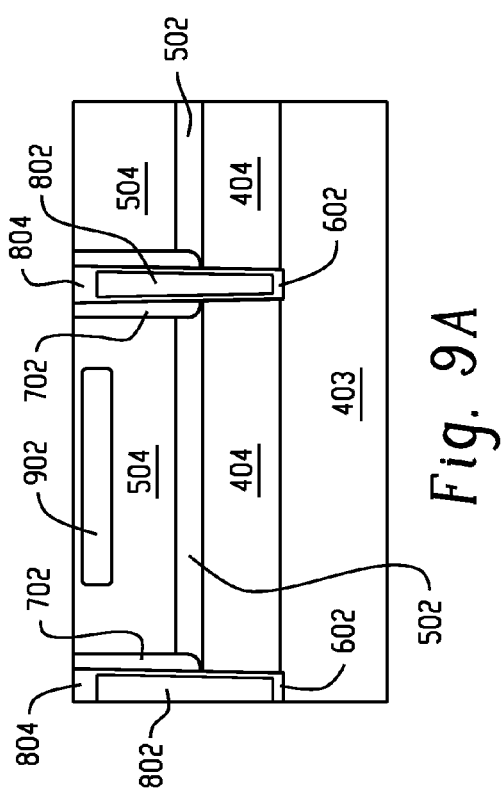
Fig. 9A

PHOTODIODES AND FABRICATION THEREOF

CROSS REFERENCE TO RELATED APPLICATION

This application claims the benefit of U.S. provisional application Ser. No. 60/13,859 filed Apr. 24, 2007, which is incorporated by reference.

The following relates to photodiodes, and especially to arrays of Geiger-mode avalanche or other photodiodes. It finds particular application to detectors for use in positron emission tomography (PET) and single photon emission computed tomography (SPECT) systems, optical imaging devices, and other applications in which arrays of photosensors are deployed.

Various applications in the medical and other domains rely on the detection of low level light pulses. PET systems, for example, include radiation sensitive detectors that detect temporally coincident 511 kilo electron volt (keV) gamma photons indicative of positron decays occurring in an examination region. The detectors include a scintillator that generates bursts of lower energy photons (typically in or near the visible light range) in response to received 511 keV gammas, with each burst typically including on the order of several hundreds to thousands of photons spread over a time period on the order of a few tens to hundreds of nanoseconds (ns).

Photomultiplier tubes (PMTs) have conventionally been used to detect the photons produced by the scintillator. PMTs are relatively bulky, vacuum tube based devices that operate at a bias voltage on the order of several thousand volts. More recently, silicon photomultipliers (SiPMs) have been introduced. SiPMs, which typically include an array of Geiger-mode APDs fabricated on a common semiconductor substrate, are relatively more compact and robust that comparable PMTs. They also operate at relatively lower bias voltages, with currently available devices operating at voltages on the order of about twenty (20) to eighty (80) volts (V).

As SiPMs are semiconductor-based devices, it is possible to integrate CMOS readout electronics such as logic or gating circuitry, analog to digital converters, time to digital converters, and the like on the same substrate as the photodiodes. See WO 2006/111883 A2, *Digital Silicon Photomultiplier for TOF-PET*. However, the performance characteristics of SiPMs are deleteriously affected by defects in the active region of the APDs. These defects are typically reduced by adding additional processing steps such as extra gettering and high temperature annealing operations to the device fabrication process. Unfortunately, these processing steps (and especially the high temperature anneal) can be incompatible with standard CMOS processing techniques, thereby complicating device fabrication.

The performance of a diode array is also influenced by the boundary regions of the diodes in the array. In the case of a Geiger-mode APD, the boundary region can affect the diode's breakdown properties. In the case of a PIN photodiode, the boundary region can also influence the diode leakage or dark current. The size of the boundary also influences the area efficiency of the array. To improve the area efficiency, it is generally desirable reduce the size of the guard ring while maintaining suitable breakdown and/or leakage properties.

FIG. 1 shows the cross-section of a conventional n-on-p Geiger-mode APD. FIG. 2 shows the cross-section of a conventional n-on-p PIN photodiode. The devices include a relatively highly doped p-type substrate 102 which forms the diode anode, a lightly p-doped epitaxial layer 104, an n-type cathode 106, and a deep isolation trench 108 filled with polysilicon. The Geiger-mode APD also includes a p-type field enhancement region 110. The APD includes a lightly doped guard ring 112. In the case of the PIN diode, the guard ring 114 is implemented using a field plate. In each case, the guard rings 112, 114 are located substantially at the surface of the diode and spread laterally in the direction of the trench isolation 108. Unfortunately, the lateral geometry of the guard rings limits the diode area efficiency.

Aspects of the present application address these matters and others.

In accordance with one aspect, a photodiode includes an anode, a cathode, a buried component, and a vertical electrode in operative electrical communication with the buried component.

According to another aspect, a method of producing a semiconductor device that includes a photodiode is provided. The method includes forming a deep isolation trench in a semiconductor material, forming a component of the photodiode in the semiconductor material, and forming an electrode along a sidewall of the isolation trench. The electrode makes an electrical contact with the component.

According to another aspect, a silicon photomultiplier includes a semiconductor substrate, a plurality of avalanche photodiodes carried by the substrate, CMOS circuitry carried by the substrate, and an isolation well that isolates an avalanche photodiode from the CMOS circuitry. The isolation well includes a vertical electrode operatively connected to a buried semiconductor layer.

According to another aspect, a method of producing a silicon photomultiplier includes forming a plurality of isolation wells on a semiconductor wafer, wherein the isolation wells include a vertical contact in operative electrical communication with a buried isolation layer. The method also includes forming a component of an avalanche photodiode in the isolation wells and, following the formation of the component, forming CMOS circuitry on the wafer.

Still further aspects of the present invention will be appreciated to those of ordinary skill in the art upon reading and understand the following detailed description.

The invention may take form in various components and arrangements of components, and in various steps and arrangements of steps. The drawings are only for purposes of illustrating the preferred embodiments and are not to be construed as limiting the invention.

FIG. 4 is a partial cross-sectional view of a semiconductor substrate.

FIGS. 5A-12A are partial cross-sectional views of a first SiPM having integrated readout circuitry at various stages in the in the fabrication process.

FIGS. 5B-12B are partial cross-sectional views of a second SiPM having integrated readout circuitry at various stages in the fabrication process.

Conventionally, the standard CMOS fabrication process is considered to include two major components: front end of line (FEOL) and back end of line (BEOL) processing. During FEOL processing, which is generally considered to end with sicilidation, the desired active devices (e.g., transistors, diodes, etc.) are implemented. Interconnect metal/isolation stacks are implemented as part of the BEOL processing.

A typical CMOS process flow starts with a p-type substrate covered with an optional epitaxial p-type layer. FEOL processing steps typically include isolation (e.g., shallow trench isolation (STI) or local oxidation of silicon (LOCOS)) to isolate the devices from each other, retrograde well implantation and annealing, gate oxide growth, polysilicon gate and spacer formation, source/drain implantation, and rapid thermal annealing (RTA).

To minimize the impact on the CMOS fabrication process, it is desirable that some or all of the APD processing be performed prior to that of the CMOS devices. As will be described more fully below, the APDs are implemented during FEOL processing, with an optional isolation trench and optical window being implemented during BEOL processing. While the following discussion will describe the implementation of a single p-on-n diode, those of ordinary skill in the art will appreciate that an array of such devices is ordinarily fabricated in connection with the fabrication of an SiPM. Moreover, an n-on-p diode structure may be implemented by interchanging the n-type and p-type dopings.

Figure 1:
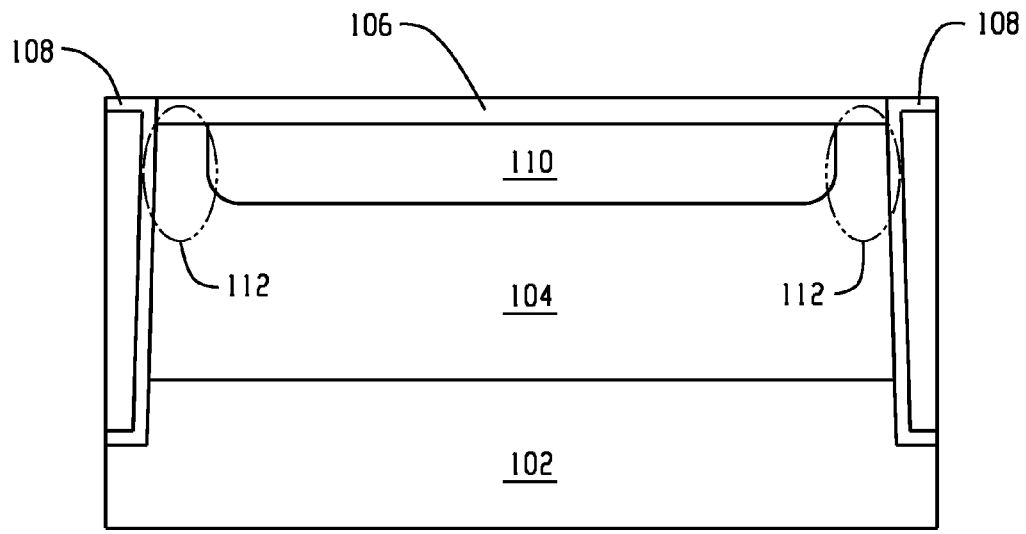
FIG. 1 is a cross-sectional view of a prior art Geiger-mode APD.
Figure 2:
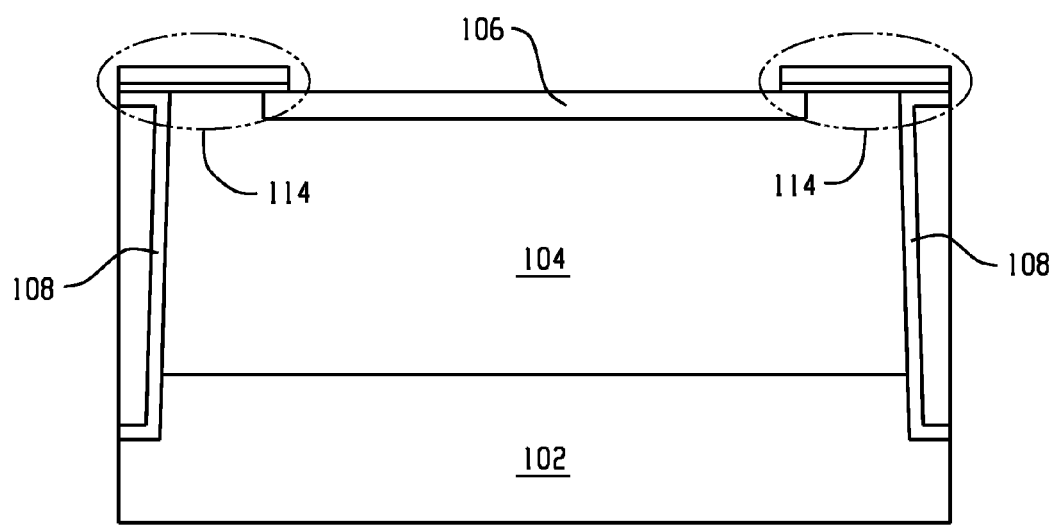
FIG. 2 is a cross-sectional view of a prior art PIN photodiode.
Figure 3:
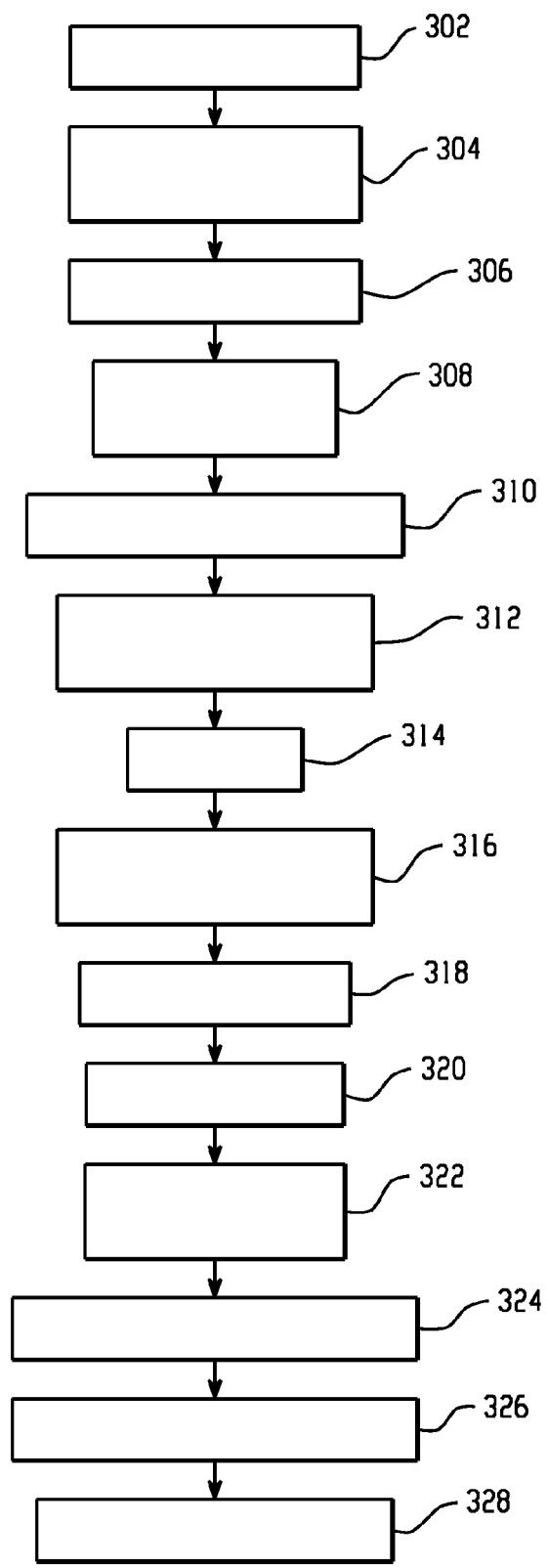
FIG. 3 depicts a method of fabricating an SiPM having integrated readout circuitry.

Fabrication of an SiPM having integrated CMOS circuitry will now be described. With reference to FIGS. 3 and 4, a substrate 402 is obtained at step 302. As illustrated, the substrate 402 includes a highly doped p-type substrate layer 403 and an epitaxial p-type layer 404.

As the APDs are operated at relatively high voltages compared those of the CMOS circuits, the APDs are located in isolating wells. Depending on the biasing conditions, the wells must withstand up to the full breakdown voltage of the APDs. With reference to FIGS. 3 and 5A, a buried n-type isolation layer 502 is fabricated at 304.

The buried layer 502 may be formed by growing an epitaxial layer over a highly doped, shallow well structure. According to such an implementation, the layer 502 is formed in the substrate 402 by implantation or diffusion. As the implantation energy is relatively low, the implantation dose can be relatively greater, which improves the conductivity of the layer 502. Diffusion ordinarily does not damage the silicon lattice. Following implantation or diffusion, an n-type epitaxial layer 504 is grown to the desired thickness. As the thickness of such a layer is generally unrestricted by other process parameters, the breakdown voltage in the guard ring may be increased without compromising the quality of the silicon in the active region. For APDs operating in the range of about 20-50V, typical thicknesses would be in the range of about 2-3 μm. Note that damage introduced during implantation tends to be annealed out during the epitaxy process.

In another implementation, the n-type layer 504 is formed on the substrate 402 and the buried layer 502 is formed in the layer 504 by deep implantation. The maximum implantation depth depends largely on the energy of the implantation equipment and the ion used. Currently available techniques can provide an implantation depth of about 2 micrometers (μm). Because damage to the silicon lattice is a function of the dose and energy, implantation is best suited to relatively lightly doped, shallow wells 502. Note that the damage can be alleviated by a relatively long, high temperature anneal, although doing so tends to reduce the doping profile of the buried well.

As illustrated in FIG. 5A, the layer 502 covers the entire wafer. Such a blanket layer is ordinarily simpler and cheaper than a masked implementation, although it is best suited for CMOS processes qualified for high-resistivity substrates. Moreover, the resulting p-n junction offers additional protection from radiation-induced carriers in the substrate. Special attention should also be paid to the placement of the layer 502 and substrate 402 contacts to minimize latch-up problems. The doping profile of the substrate 402 is relatively unimportant, provided that it provides a p-n junction. The substrate should, however, provide a sufficient density of gettering sites.

The layer 502 may also be realized via a mask. As illustrated in FIG. 5B, the masked layer 502 may then be confined to the portion of the chip containing the APD, leaving the CMOS portion of the device open to the substrate 402, thus facilitating a substrate connection, if needed.

With reference to FIGS. 3, 6A, and 6B, a deep trench 602 is etched at 306.

With reference to FIGS. 3, 7A, and 7B, a vertical contact or electrode 702 is formed at 308 so as to contact the buried layer 502 and hence form an isolation well. In one implementation, the electrode 702 is formed using a quad implant into the trench 602 sidewall, through a sacrificial oxide layer. Depending on the geometry of the trench 602, an implantation angle of about thirty degrees)(30°) is suitable.

The sidewall implant causes an increase in the dopant concentration at the bottom of the trench 602. As illustrated in FIGS. 7A and 7B, the trench 602 is deep enough to reach the highly doped substrate layer 203. In such a case, the substrate 203 doping level may be high enough to counter-dope the increased doping from the side wall implant. The increased concentration may also be counter-doped by a dedicated perpendicular implant. The trench 602 may also be etched in a two step process in which the trench 602 is etched to a first depth prior to the contact formation step 308. The trench 602 is then etched to the desired depth following formation of the contact 702.

With reference to FIGS. 3, 8A, and 8B, the trench is filled at 310, for example by filling the trench 602 with polysilicon 802 and oxide 804.

With reference to FIGS. 3, 9A and 9B, the APD field enhancement region 902 is implanted at 312. In the described p-on-n diode implementation, the field enhancement region is relatively highly n-type doped region. As will be appreciated, the high field region 902 defines the breakdown voltage of the APD.

With reference to FIG. 3, a relatively long, high temperature anneal is applied at 314 to anneal the damage from the implantation step 312. The annealing 314 should be performed prior to the relevant CMOS processing.

Figure 10B:
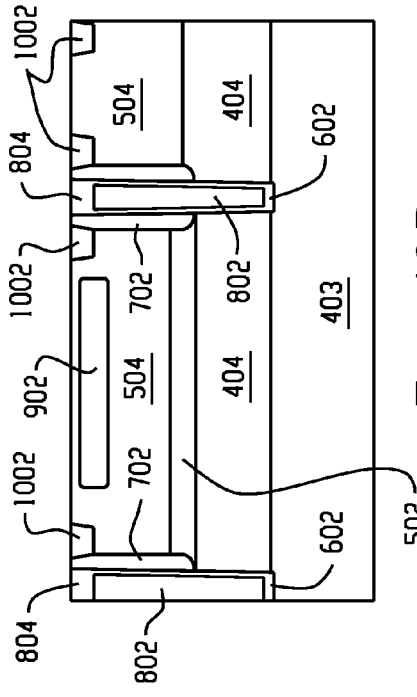
Figure 10A:
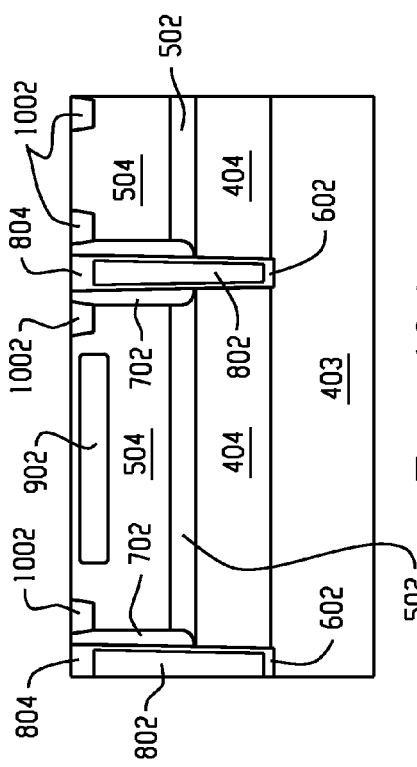

With reference to FIGS. 3, 10A, and 10B, device isolation trenches 1002 are formed at 316, for example by way of STI or LOCOS. To reduce or avoid the diffusion of defects from the bulk to the active region of the device, the thermal steps of the CMOS processing should be minimized To this end, the device isolation step 316 may advantageously be combined with the trench isolation step 310 and/or performed prior to the high field implantation 312 and high temperature annealing 314 steps.

Figure 11B:
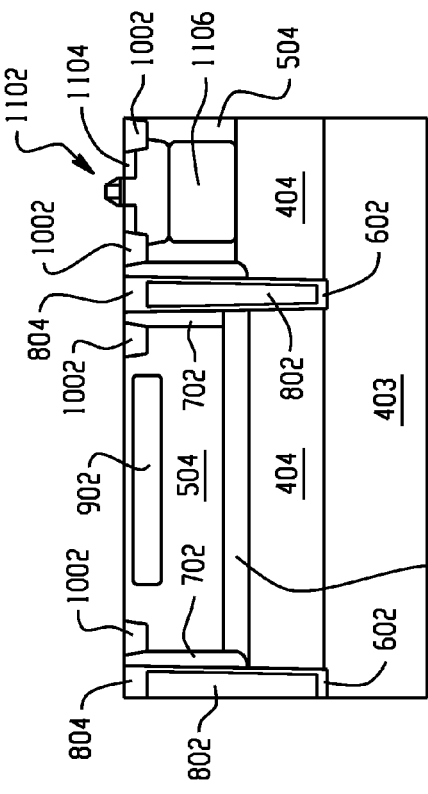
Figure 11A:
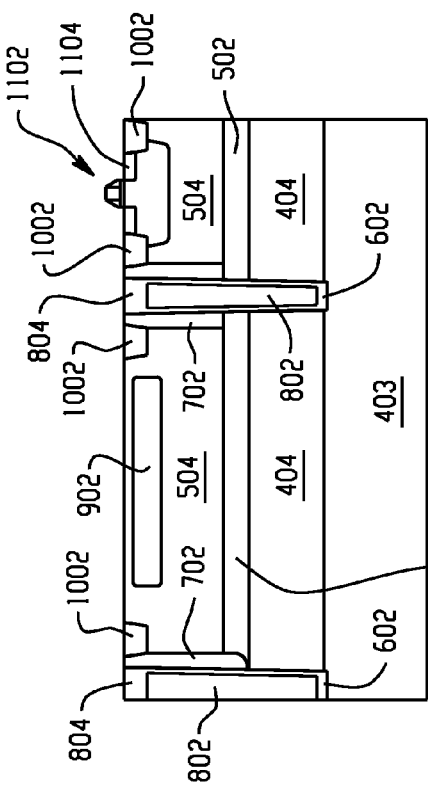

The remaining steps of the standard CMOS process flow, together with related operations such as flash and the like, begin at step 318 and are used to implement the desired readout electronics. Note that the CMOS processing is unaffected by the thermal steps required for the formation of the APD. A representative NMOS FET 1102 of the readout electronics is shown schematically in FIGS. 11A and 11B. If a masked well 502 was used, then a contact 1106 between the p-well 1104 of the FET 1102 and the substrate 202 can be formed via an additional deep implant operation. For a blanket well 502, the p-well 1104 is contacted separately from the top side. The standard CMOS process flow stops just prior to the rapid thermal anneal used to activate the source-drain implants.

Figure 12A:
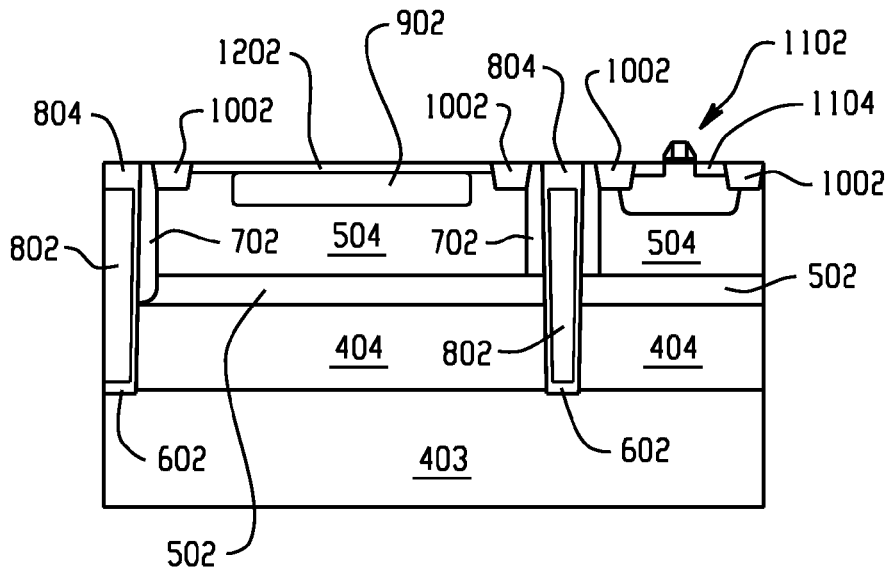
Figure 12B:
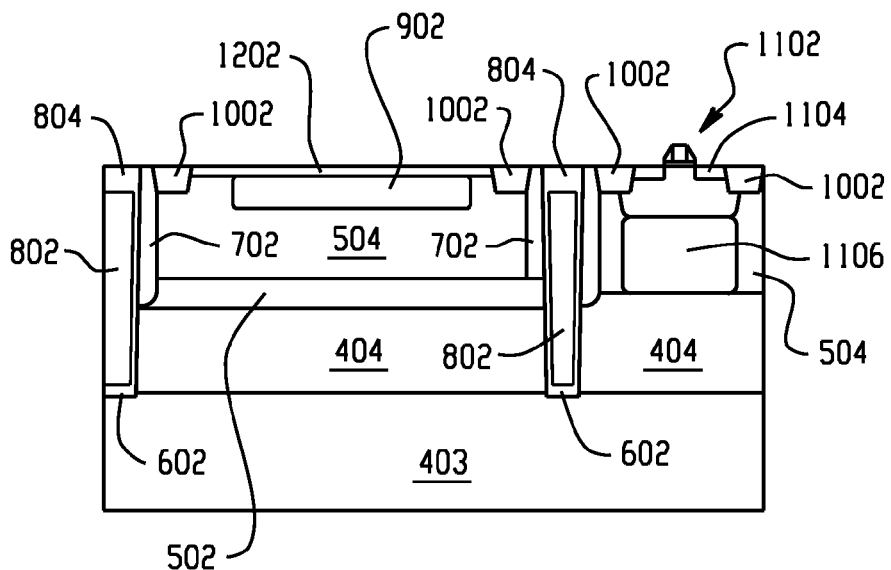

With reference to FIGS. 3, 12A, and 12B, the APD anode 1202 is formed at step 320, for example via implantation or vapor phase diffusion. As the majority of the carriers are generated in a very thin layer near the surface of the APD, it is desirable that the anode 1202 be very shallow, particularly in the case of an APD that is sensitive to photons having relatively short wavelengths.

At step 322, a rapid thermal anneal (RTA) is performed to activate the source-drain implants. The RTA time should be minimized in order to keep the anode diffusion low, for example by way of a spike or flash anneal.

The BEOL processing is performed at step 324. The BEOL processing may include an additional masked step to re-open the trench 602 to the approximate depth of the n-type layer 304. The trench 602 is then filled with a metal such as tungsten.

The APD optical window is formed at step 326. This may be accomplished by etching the optical window in the BEOL oxide stack. A thin layer of passivation nitride, which can serve as an anti-reflective coating or optical filter, is deposited at the optical window.

If desired, a suitable scintillator is placed in optical communication with the light sensitive side of the device at step 328, for example using a suitable optical adhesive.

Figure 13:
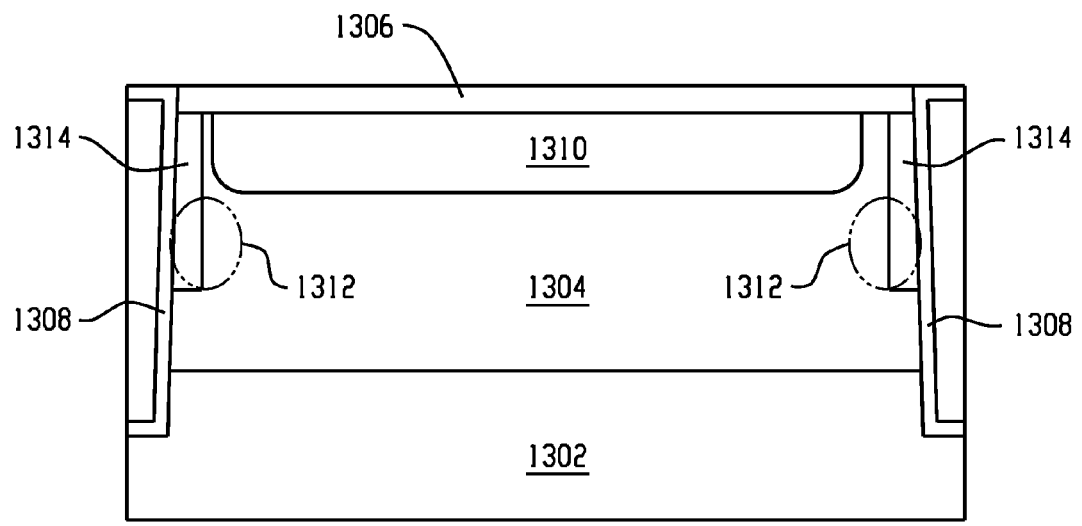
FIG. 13 is a cross-sectional view of an avalanche photodiode.

An alternative semiconductor device structure that includes an APD and a vertical guard ring will now be described in relation to FIG. 13. As illustrated, the APD include a relatively highly doped p-type substrate 1302 which forms the diode anode, a lightly p-doped epitaxial layer 1304, an n-type cathode 1306, a deep isolation trench 1308 filled with polysilicon, and a p-type field enhancement region 1310. A lightly doped guard ring 1312 is located along the isolation trench 1308 and generally below the field enhancement region 1310. A vertical electrode 1314 is likewise located along the isolation trench and provides an electrical connection to the guard ring 1312. The in-situ doped polysilicon fill of the trench 1308 can be used as a field plate and hence to enhance the robustness of the guard ring 1312. The field plate can be connected to the substrate 1302, from the top side of the device (as illustrated in FIG. 13), or both. In the latter case, the polysilicon fill can also provide a low ohmic contact to the substrate 1302.

Figure 14:
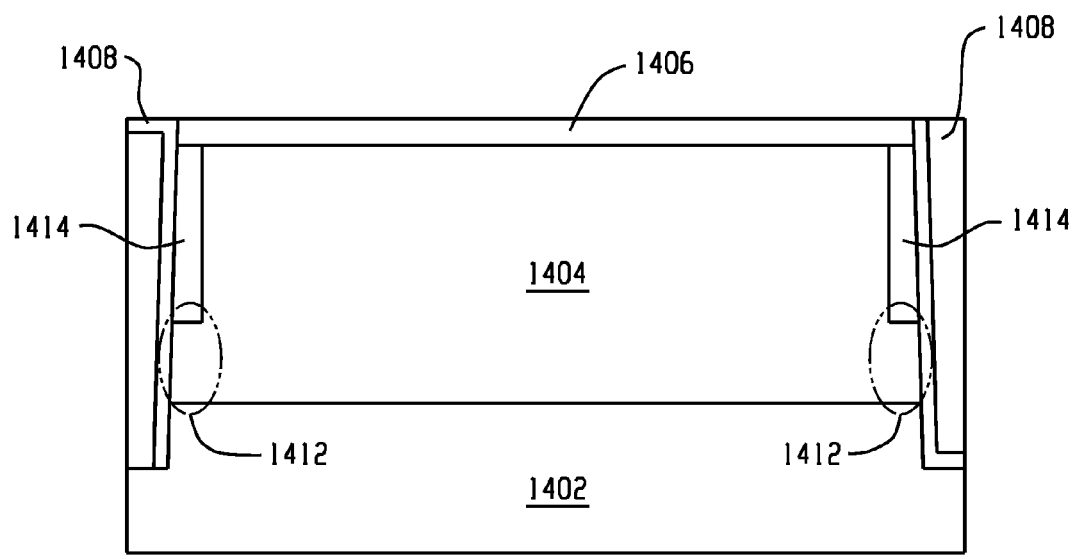
FIG. 14 is a cross-sectional view of a linear photodiode.

An alternative linear photodiode structure that includes a vertical guard ring will now be described in relation to FIG. 14. As illustrated, the diode includes a relatively highly doped p-type substrate 1402 which forms the diode anode, a lightly p-doped epitaxial layer 1404, an n-type cathode 1406, and a deep isolation trench 1408 filled with polysilicon. A lightly doped guard ring 1412 is located along the isolation trench 1308 and generally buried in the device. As illustrated, the guard ring 1412 is located substantially adjacent the substrate 1402, the guard ring 1412 may also be spaced away from the substrate 1402 in a manner analogous to the guard ring 1312. A vertical electrode 1414 extends along the isolation trench 1408 and provides an electrical connection to the guard ring 1412. The in-situ doped polysilicon fill of the trench 1408 can again be used as a field plate and, in the case of a linear diode, reduce the device leakage current. The field plate can be connected to the substrate 1402, from the top side of the device, or both (as illustrated in FIG. 14).

The vertical electrode 1314, 1414 may be formed by implantation, diffusion, or epitaxy. The process is simplified if the trenches 1308, 1408 and electrodes are 1314, 1414 are formed last in the process. However, such an approach may complicate the formation of a shallow junction on top of the diode due to the thermal budget needed in the oxidation of the trench walls. As an alternative, the APD high field region 1310 may be formed first, followed by the trench 1308, 1408 etch, vertical electrode 1314, 1414 formation, oxidation, polysilicon deposition, and formation of the planar electrodes.

As noted above, the vertical electrodes 1314, 1414 may be formed by quad implantation in the trench 1308, 1408 sidewalls. Arsenic or other suitable dopant is implanted through a thin screening oxide. The implantation is performed at an oblique angle with respect to the sidewall via quad implantation. Again depending on trench 1308, 1408 geometry, suitable implantation angels are in the range of roughly 30° to 45°. The thickness of the implanted layer is a function of the dose, energy, and subsequent thermal steps. A depth of about 1 μm or less is typically suitable. To reduce the effect on the photodiode dark count rate, a thermal anneal should be performed after the implantation to alleviate damage induced by the implantation process.

The vertical electrodes 1314, 1414 may also formed using an in-situ doped polysilicon layer and a drive in diffusion step so as to create a clean, shallow junction. According to such an approach, the trench 1308, 1408 is etched in a two step process. First, the trench 1308, 1408 is etched to the desired vertical depth of the electrode 1314, 1414. A thin in-situ phosphorus doped polysilicon film is deposited on the sidewalls of the trench 1308, 1408. A drive-in diffusion is performed to transfer phosphorus from the polysilicon into the trench 1308, 1408 wall so as to form the junction. A junction depth of about 200 nanometers (nm) or less is suitable. The trench 1308, 1408 is then oxidized and self-align etched to its final depth. The polysilicon film also provides gettering sites and helps remove impurities from the diode active region. Note that formation of the vertical electrode 1314, 1414 may also be combined with the cathode formation step.

A thin layer of monocrystalline silicon can be used instead of polysilicon. Such a technique tends to enhance sensitivity to the blue part of the spectrum, as the film can be made quite thin (e.g., on the order of about 10 nm) while still providing a well defined shallow junction.

As another alternative, a direct diffusion with a rapid thermal processing step can be performed. While the monocrystalline silicon and direct diffusion techniques do not benefit from the gettering properties of the polysilicon, a dedicated gettering step may be combined with the formation of the high field region prior to etching of the deep trench.

Note that the foregoing techniques can also be used to form the vertical electrode 502.

The polysilicon fill of the trench can be highly in-situ doped with a suitable dopant such as arsenic or phosphorous and can serve several purposes. If connected to the substrate or to a different potential, it can influence the conductivity of the silicon next to the trench in a manner similar to the gate in a CMOS transistor. Thus, it can be used as a field plate and can help suppress leakage current at the perimeter of the diode. It can also be used to form the electric field in the guard ring region to help prevent edge breakdown. In Geiger-mode devices, it can also serve as an optically opaque barrier and hence reduce optical cross talk between neighboring devices.

Figure 15:
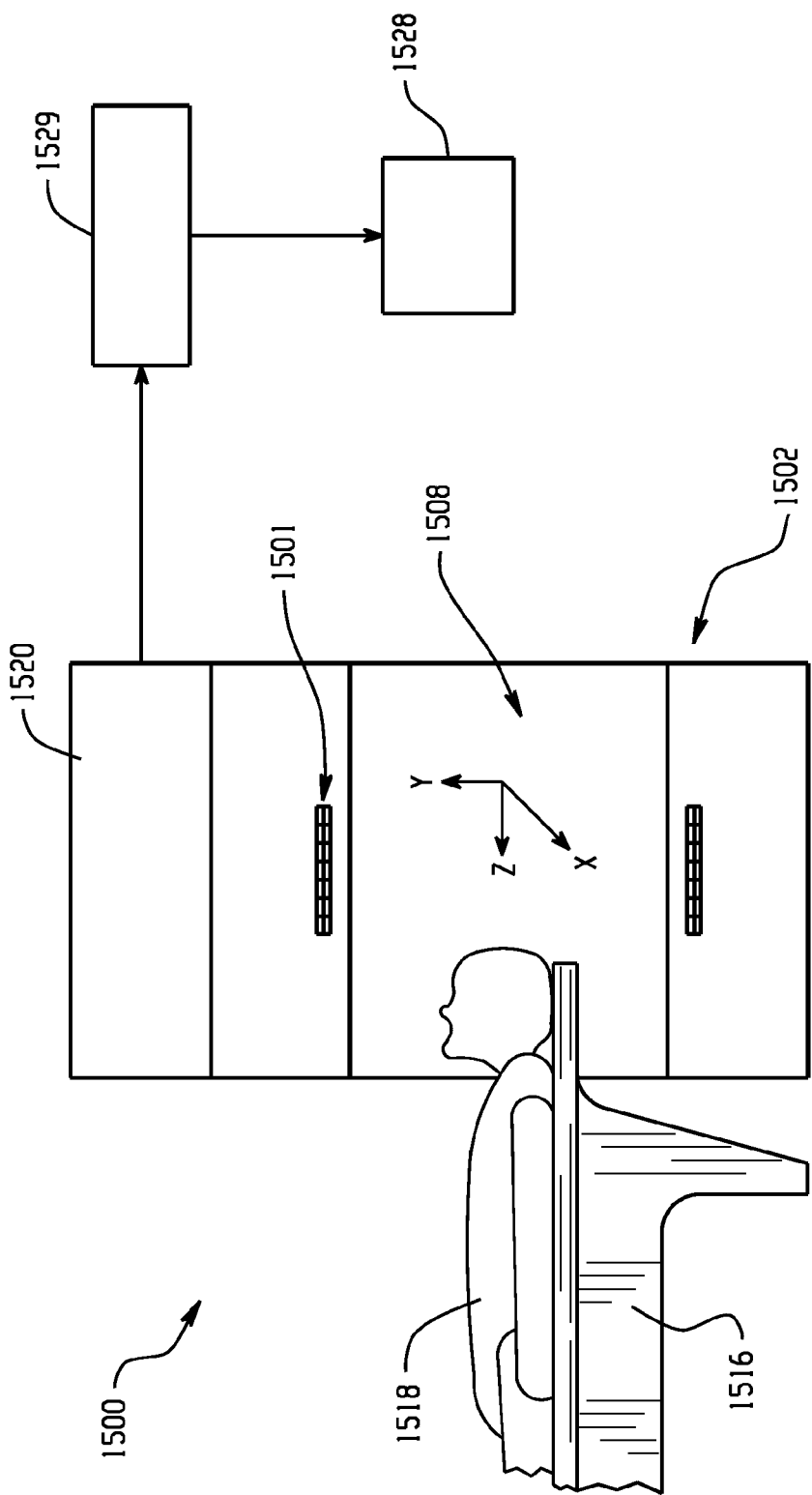
FIG. 15 depicts a PET system.
Figure 16:
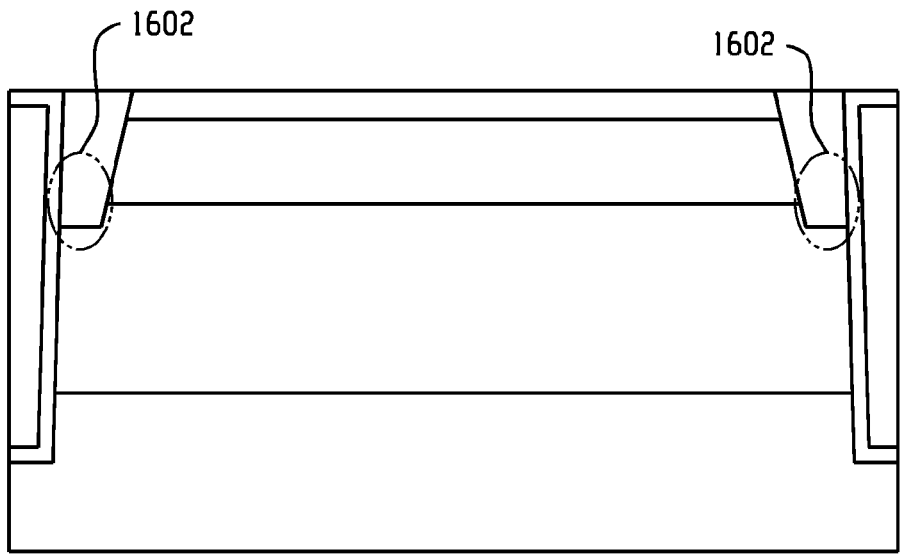
FIG. 16 is a cross-sectional view of an avalanche photodiode.
Figure 17:
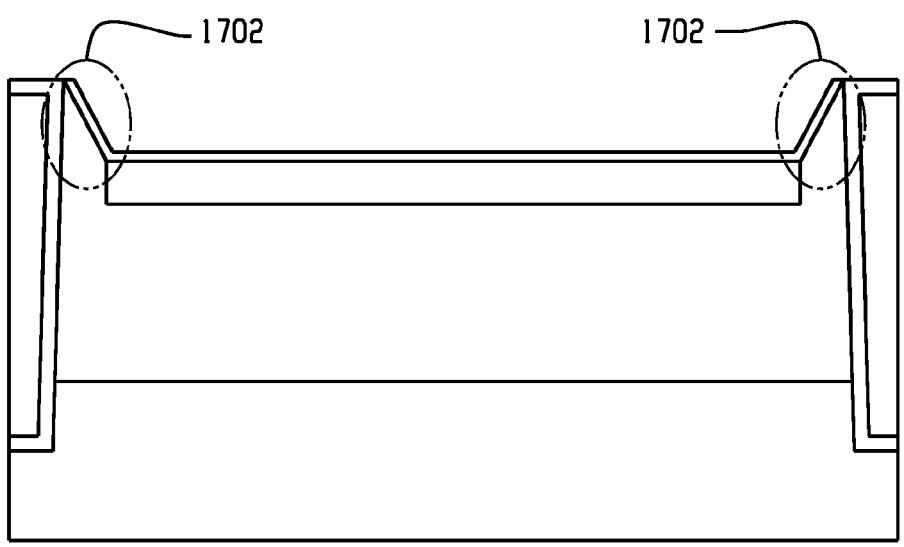
FIG. 17 is a cross-sectional view of a linear photodiode.

Further improvement can be achieved by introducing slanted edges 1602, 1702 at the perimeter of the diode as shown schematically in FIGS. 16 and 17. The edges can be formed during the etching process. The diode should also be provided with a suitable anti-reflective, filtering, or other optical coating to improve the transmission of the desired light wavelengths into the silicon On application for the detector arrays described above is in PET systems. With reference to FIG. 15, a PET system 1500 includes a gantry 1502 having a plurality of detector arrays 1501 surrounding an examination region 1508. In a PET application, the detector arrays 600 are used in connection with coincidence detection circuitry to detect 511 keV gamma ray pairs generated by positron annihilation events occurring in the examination region 1508.

An object support 1516 supports an object to be imaged 1518, such as a human patient. The object support 1516 is preferably longitudinally movable in coordination with operation of the PET system 1500 so that the object 1518 can be scanned at a plurality of longitudinal locations.

A data acquisition system 1520 provides projection data which includes a list of annihilation events detected by the detector arrays 1500. The projection data may also include TOF information. A reconstructor 1529 generates volumetric image data indicative of the distribution of the radionuclide in the object 1518.

A workstation computer serves as an operator console 1528. The console 1528 includes a human readable output device such as a monitor or display and input devices such as a keyboard and mouse. Software resident on the console 1528 allows the operator to view and otherwise manipulate the volumetric image data generated by the reconstructor 1529. Software resident on the console 1528 also allows the operator to control the operation of the system 1500 by establishing desired scan protocols, initiating and terminating scans, and otherwise interacting with the scanner. Reconstructed image data may also be made available to other computers associated with the system 100 or otherwise having access to a common network such as a picture archiving and communication (PACS) system, hospital information system/radiology information system (HIS/RIS) system, the internet, or the like.

Variations on the system 1500 are also possible. Thus, for example, the PET system 1500 may be combined with a computed tomography (CT), magnetic resonance (MR), x-ray or other system. The additional information is typically used to provide structural information about the object 1518, and can be used to perform attenuation correction on the acquired PET data.

Moreover, individual detectors or detector arrays 1501 may be used to detect radiation other 511 keV gamma radiation, and in other than tomographic applications. For example, the detectors may be used in nuclear imaging systems such single photon emission computed tomography (SPECT), x-ray computed tomography (CT), or x-ray imaging systems. The detectors may also be used in fluorescence or other optical imaging systems. The detector arrays 600 may also be disposed in a planar, arcuate or other non-circular arrangement. Where the objective is to detect light radiation or other radiation falling within the sensitive region of the photodiodes, the scintillator may also be omitted.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. A Geiger-mode avalanche photodiode comprising:
   a diode, including:
      a cathode of the diode that receives incident radiation;
      an anode of the same diode located with respect to the cathode along a direction of the incident radiation;
      a first epitaxial layer located between the anode and the cathode along the direction of the incident radiation;
      an electrically conductive guard ring located in the first epitaxial layer between the cathode and the anode along the direction of the incident radiation;
      a vertical electrode located in the first epitaxial layer between the cathode and the anode along the direction of the incident radiation, wherein the vertical electrode is in operative electrical communication with the guard ring and provides an electrical connection to the guard ring; and
      an isolation trench that surrounds the vertical electrode and the electrically conductive guard ring.

2. The photodiode of claim 1 wherein the electrically conductive guard ring includes a buried semiconductor layer, and the Geiger-mode avalanche photodiode includes a semiconductor substrate and readout circuitry, wherein the photodiode and the readout circuitry are formed on the substrate, the vertical electrode and the buried semiconductor layer form an isolation well, and the readout circuitry is located outside the isolation well.

3. The photodiode of claim 2 wherein the buried layer is formed by shallow implantation or diffusion of the first epitaxial layer and the photodiode includes a second epitaxial layer grown over the buried layer.

4. The photodiode of claim 1 including a substrate and CMOS circuitry, wherein the photodiode and the circuitry are formed on the substrate, and the photodiode includes a field enhancement region formed prior to the formation of the CMOS circuitry.

5. The photodiode of claim 4 wherein the field enhancement region is formed by implantation.

6. The photodiode of claim 1 wherein the isolation trench further surrounds the first epitaxial layer of the photodiode, wherein the vertical electrode is located at a side of the isolation trench that faces the active region.

7. The photodiode of claim 6 wherein the vertical electrode is formed by implantation, diffusion, or epitaxy.

8. The photodiode of claim 1 wherein the vertical electrode is in operative electrical communication with the guard ring.

9. The photodiode of claim 8 wherein the photodiode includes a field enhancement region, and wherein the electrically conductive guard ring is located below the field enhancement region.

10. A method of producing a semiconductor device that includes a Geiger-mode avalanche photodiode, the method comprising:
    forming a cathode of a photodiode, the cathode comprising a photosensitive surface which receives incident radiation;
    forming an anode of the photodiode, the anode located with respect to the cathode in a direction of the incident radiation on the photosensitive surface and parallel with an offset from the cathode;
    forming a deep isolation trench in a semiconductor material;
    forming an electrically conductive guard ring of the photodiode in the semiconductor material, wherein the electrically conductive guard ring is between the cathode and the anode in the direction of the incident radiation and is surrounded by the deep isolation trench; and forming an electrode along a sidewall of the isolation trench, wherein the electrode is located between the cathode and the anode in the direction of the incident radiation and provides an electrical connection to the electrically conductive guard ring.

11. The method of claim 10 wherein the semiconductor device includes CMOS circuitry and the method includes forming a field enhancement region in the semiconductor material;

processing the CMOS circuitry; and annealing the semiconductor material to repair a defect resulting from the formation of the field enhancement region, wherein the step of annealing is performed prior to the step of processing.

12. The method of claim 10 wherein the semiconductor device includes CMOS circuitry and the method includes depositing a metal in the isolation trench during a back end of line processing of the CMOS circuitry.

13. The method of claim 10 wherein the semiconductor devices includes CMOS circuitry and the method includes forming a photodiode optical window during a back end of line processing of the CMOS circuitry.

14. The method of claim 10 wherein the electrically conductive guard ring is a buried layer and the electrode and the buried layer form an isolation well that surrounds a region of the photodiode.

15. The method of claim 10 including forming the buried layer by shallow implantation or diffusion;

growing an epitaxial layer over the buried layer.

16. The method of claim 10 wherein the component is a buried guard ring.

17. The method of claim 10 wherein forming the deep trench includes etching the trench to a first depth prior to the formation of the electrode and etching the trench to a second depth following the formation of the electrode.

18. The method of claim 10 wherein the semiconductor material includes a highly doped substrate and wherein a field plate is operatively electrically connected to the substrate.

* * * * *